United States Patent [19]

Kitagawa et al.

[11] Patent Number: 5,057,702

[45] Date of Patent: Oct. 15, 1991

[54] DUTY RADIO CONTROL CIRCUIT APPARATUS

[75] Inventors: Nobutaka Kitagawa, Kawasaki; Hiroki Muroga; Tomotaka Saito, both of Yokohama, all of Japan

[73] Assignee: Kabushiki Kaisha Toshiba, Kawasaki, Japan

[21] Appl. No.: 457,875

[22] Filed: Dec. 27, 1989

[30] Foreign Application Priority Data

Dec. 28, 1988 [JP] Japan ................... 63-328922

[51] Int. Cl.$^5$ .............................................. H03K 5/22
[52] U.S. Cl. .................................... 307/268; 307/265; 307/480; 307/490
[58] Field of Search ............... 307/265, 269, 268, 490, 307/491, 480

[56] References Cited

U.S. PATENT DOCUMENTS

| | | | |
|---|---|---|---|
| 4,475,086 | 10/1984 | Allen | 307/265 |
| 4,509,494 | 4/1985 | Nishitoba et al. | 307/265 |
| 4,803,384 | 2/1989 | Yamane et al. | 307/490 |
| 4,881,041 | 11/1989 | Kawanabe et al. | 307/265 |
| 4,891,825 | 1/1990 | Hansen | 307/265 |
| 4,968,898 | 11/1990 | Hushimi et al. | 307/268 |

OTHER PUBLICATIONS

Sauer, D. J., Design and Performance of a CCD Comb Filter IC; RCA Review, vol. 41, pp. 29, 36–40, published Mar. 1980.

*Primary Examiner*—David Hudspeth
*Assistant Examiner*—Scott A. Ouellette
*Attorney, Agent, or Firm*—Finnegan, Henderson, Farabow, Garrett, and Dunner

[57] ABSTRACT

An integrating circuit integrates an input signal. When an output from the integrating circuit is input to an AC coupling circuit, only an AC component of the output is extracted. The AC component which passes through the AC coupling circuit is waveshaped and coverted into a rectangular wave by a waveshaping circuit. The duty ratio of the waveshaped rectangular wave is detected by a duty ratio detecting circuit. A voltage corresponding to the duty ratio is then generated and fed back to the output of the AC coupling circuit through a feedback circuit. As a result, a DC bias component is applied to the AC component which has passed through the AC coupling circuit. In this case, the voltage generated by the duty ratio detecting circuit is controlled to coincide with the circuit threshold value of the waveshaping circuit, and a rectangular wave having a duty ratio of 50% is output from the waveshaping circuit.

16 Claims, 6 Drawing Sheets

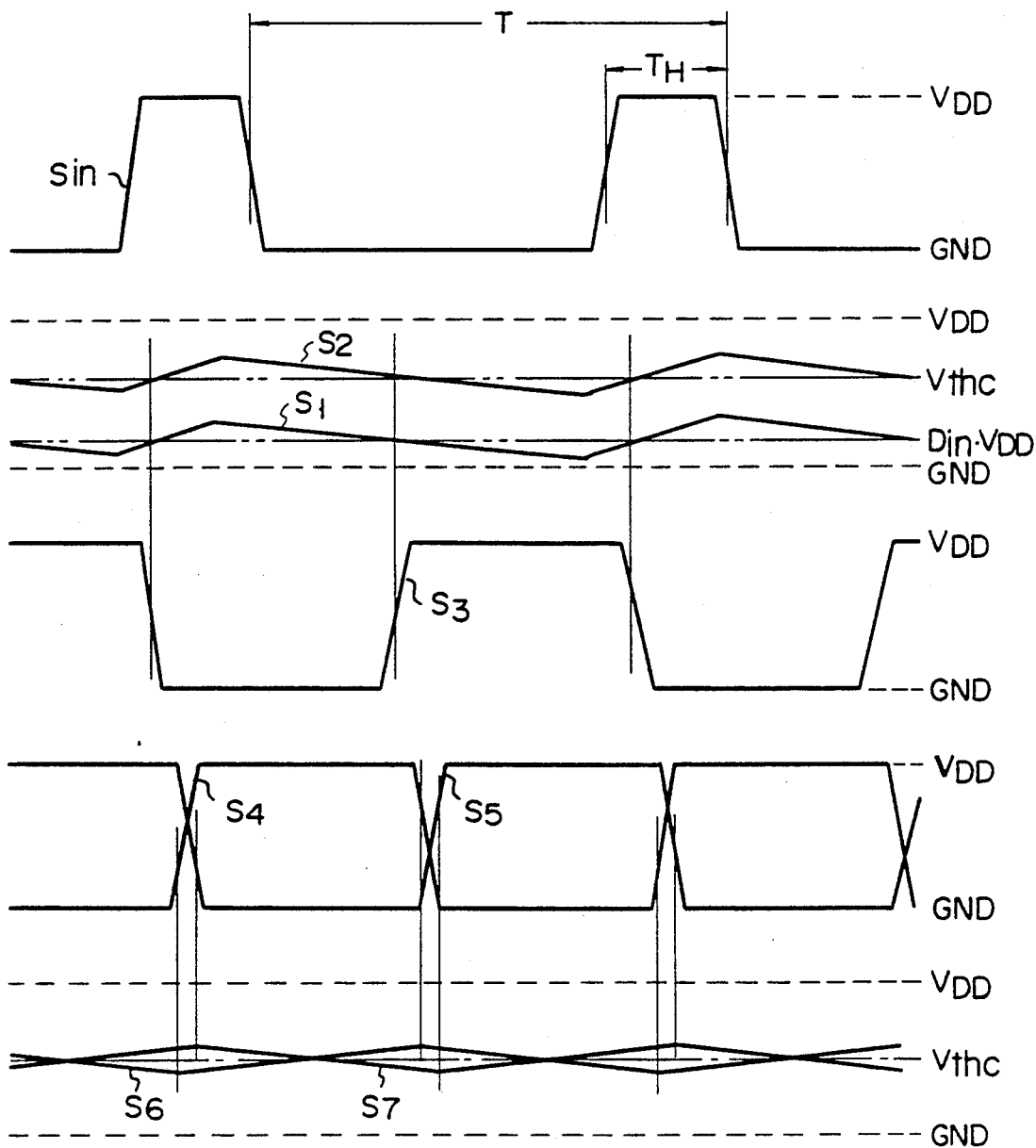
F I G. 3

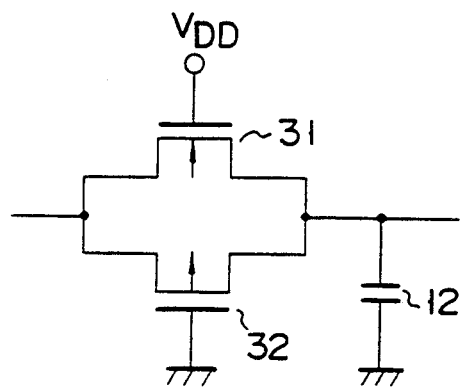
F I G. 4
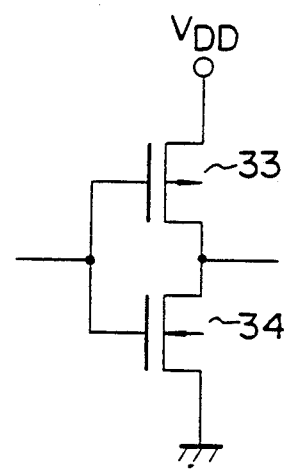
F I G. 5
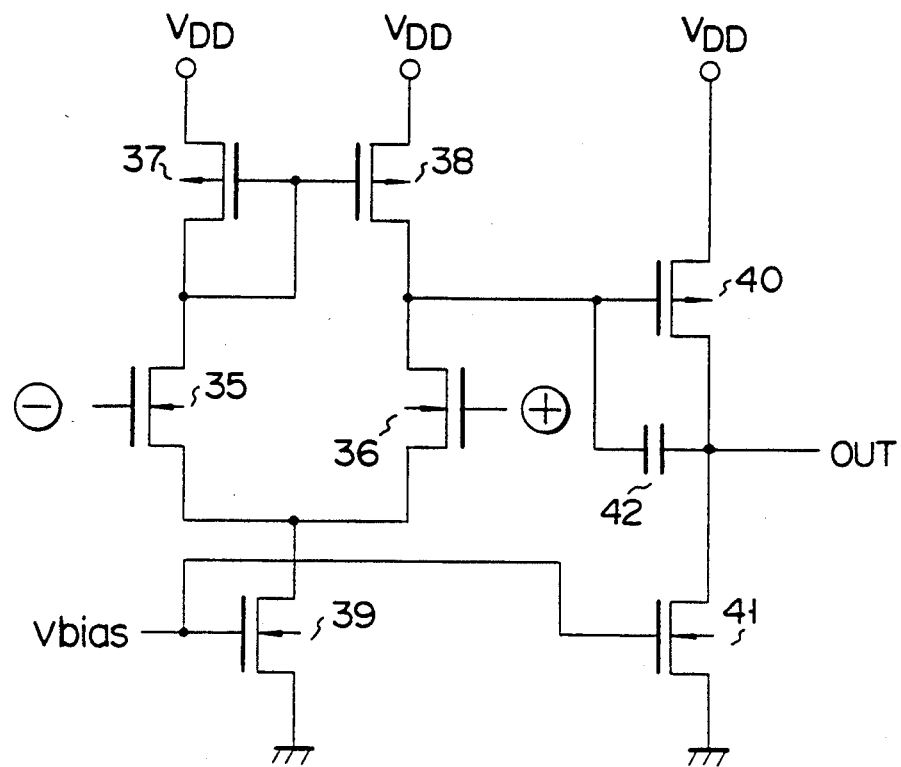
F I G. 6 ized as the output signal to be 50% or an arbitrary value.

DUTY RADIO CONTROL CIRCUIT APPARATUS

BACKGROUND OF THE INVENTION

1. Field of the Invention

The present invention relates to a duty ratio control circuit apparatus for controlling the duty ratio of an output signal to be 50% or an arbitrary value.

2. Description of the Related Art

Conventionally, when a timing signal for controlling a system is formed by inputting an output from a quartz oscillator to a timing circuit, a fundamental clock for driving the timing circuit is required to have a more accurate duty ratio as the operation speed of a system is increased. In a normal system, a fundamental clock having a duty ratio of 50% is required. For this reason, in a conventional system, a quartz oscillator is operated in advance at a frequency of an integer multiple of a desired frequency $f_0$, generally a frequency $2f_0$, twice the frequency $f_0$, and the output from the quartz oscillator is frequency-divided by a ½ frequency divider to have a duty ratio of 50%. The resultant output is then input, as a fundamental clock, to a timing circuit. In this manner, a signal having a high frequency is generated by the quartz oscilator and is frequency-divided to form a fundamental clock having a desired frequency for the following reason. Although the frequency of a signal obtained by the quartz oscillator is generally controlled with high precision, its duty ratio or waveform considerably deviates from an ideal state. Hence, such a signal cannot be directly used as a fundamental clock to be supplied to the timing circuit. In addition, a quartz oscillator of several 10 MHz or more is generally expensive and is susceptible to a mechanical shock. Besides, such an oscillator is difficult to obtain.

A circuit disclosed in RCA Review Vol. 41 March 1980, "Design and Performance of a CCD Comb Filter IC" PP. 36-PP. 40 is known as a circuit for realizing a 50% duty ratio, which is incorporated in an IC device. This circuit requires an external capacitor as a filter and can receive only signals having specific waveforms such as triangular waves and sine waves, i.e., cannot be applied to rectangular waves and the like.

In the conventional method, a circuit using a PLL circuit including a VCO (voltage-controlled oscillator) may be employed. In this case, however, the circuit arrangement becomes very complicated, and a problem is posed in terms of stability of circuit operation. Therefore, such a circuit is not preferable.

In the conventional method in which a quartz oscillator is oscillated at a frequency of an integer multiple of a desired frequency, since the frequency of the quartz oscillator or the like is high, the current consumption becomes excessively large. In addition, a frequency dividing circuit for receiving an output from the oscillator must be designed to cope with variation in duty and amplitude of an input signal, which is caused by the manufacturing process, and changes in duty and amplitude due to environmental conditions. Therefore, such a conventional method tends to greatly decrease the margin.

In addition, the circuit disclosed in the above-mentioned RCA Review requires capacitors having large capacitances as a capacitor for a low-pass filter, an input coupling capacitor, and the like, and these capacitors must be arranged outside the IC. Besides, this circuit can receive only an input signal which can be converted into a signal having a duty ratio of 50% by adjusting its DC level, such as a sine wave or a triangular wave, but cannot receive a rectangular wave. Furthermore, a circuit using a PLL circuit requires a large number of external components and incorporates potentially floating nodes, and hence is susceptible to noise. Besides, it takes a very long period of time to stabilize the circuit. Therefore, such a circuit is not preferable. Moreover, since the oscillation frequency of the VCO is dependent on power source voltage, temperature, manufacturing variation, and the like, it is very difficult to obtain stable oscillation at several 10 MHz or more. Therefore, such a circuit is very difficult to realize.

Under the circumstances, a strong demand has arisen for a duty ratio control circuit apparatus which can operate an oscillator at a frequency equal to that of a signal input to a timing circuit, can satisfactorily convert a rectangular wave as well as sine and triangular waves into a signal having a duty ratio of 50%, and can be realized in an IC without requiring any external elements.

SUMMARY OF THE INVENTION

It is, therefore, an object of the present invention to provide a duty ratio control circuit apparatus which can be easily arranged on a semiconductor substrate of a microcomputer or the like in an excellent state, and which can perform duty ratio control for an arbitrary waveform including a rectangular wave and the like, and can control the duty ratio of a signal to be an arbitrary value.

According to the present invention, there is provided a duty ratio control circuit apparatus, comprising: an integrating circuit for integrating an input signal; an AC coupling circuit for allowing an AC component of an output from the integrating circuit to pass therethrough; a waveshaping circuit for waveshaping an output from the AC coupling circuit and extracting a duty-converted output signal; a duty ratio detecting circuit for receiving a waveshaped output from the waveshaping circuit and generating a voltage corresponding to a duty of the received output; and a feedback circuit for feeding back an output from the duty ratio detecting circuit to an output side of the AC coupling circuit.

BRIEF DESCRIPTION OF THE DRAWINGS

FIG. 3 is a timing chart for explaining an operation of the embodiment shown in FIG. 2;

FIGS. 4 to 6 are circuit diagrams respectively showing detailed arrangements of components of the apparatus of the embodiment shown in FIG. 2;

DETAILED DESCRIPTION OF THE PREFERRED EMBODIMENTS

Embodiments of the present invention will be described with reference to the accompanying drawings.

Figure 1:
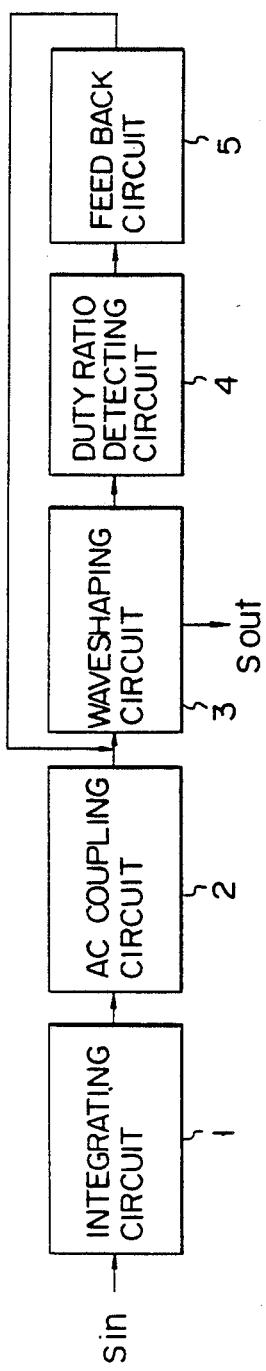
FIG. 1 is a block diagram showing a basic arrangement of a duty ratio control circuit apparatus of the present invention.

FIG. 1 is a block diagram showing a basic arrangement of a duty ratio control circuit apparatus of the present invention. The apparatus comprises: an integrating circuit 1 for integrating an input signal $S_{in}$; an AC coupling circuit 2 for allowing an AC component of an output from the integrating circuit 1 to pass therethrough; a waveshaping circuit 3 for waveshaping an output from the AC coupling circuit 2 and outputting a duty-converted signal $S_{out}$; a duty ratio detecting circuit 4 for detecting the duty of an output from the waveshaping circuit 3 and generating a voltage corresponding to the duty; and a feedback circuit 5 for feeding back the voltage generated by the duty ratio detecting circuit 4 to the output side of the AC coupling circuit 2.

The duty ratio detecting circuit 4 generates a voltage which allows the output signal $S_{out}$ to have a duty ratio of 50%. Alternatively, the circuit 4 generates a voltage which allows the output signal $S_{out}$ to have a predetermined duty ratio.

In the apparatus having the above-described arrangement, by causing the input signal $S_{in}$ to pass through the integrating circuit 1, a waveform is obtained, which gradually changes as compared with its original waveform. When this waveform passes through the AC coupling circuit 2, an AC component is extracted. In addition, this AC component is supplied to the waveshaping circuit 3 while a voltage generated by the duty ratio detecting circuit 4 is applied, as a DC bias, to the AC component. In this case, if the duty ratio detecting circuit 4 is to generate a voltage which causes the output signal $S_{out}$ to have a duty ratio of 50%, the level of the DC bias coincides with the input threshold level of the waveshaping circuit 3. As a result, a rectangular wave having a duty ratio of 50% is output from the waveshaping circuit 3.

In contrast to this, if the duty ratio detecting circuit 4 is to generate a voltage which allows the output signal $S_{out}$ to have a predetermined value, the DC bias level of the input signal to the waveshaping circuit 3 deviates from the input threshold level of the waveshaping circuit 3 by a level corresponding to the predetermined duty ratio of the duty ratio detecting circuit 4. As a result, a rectangular wave having the predetermined duty ratio is output from the waveshaping circuit 3.

Various embodiments of the present invention will be described below.

Figure 2:
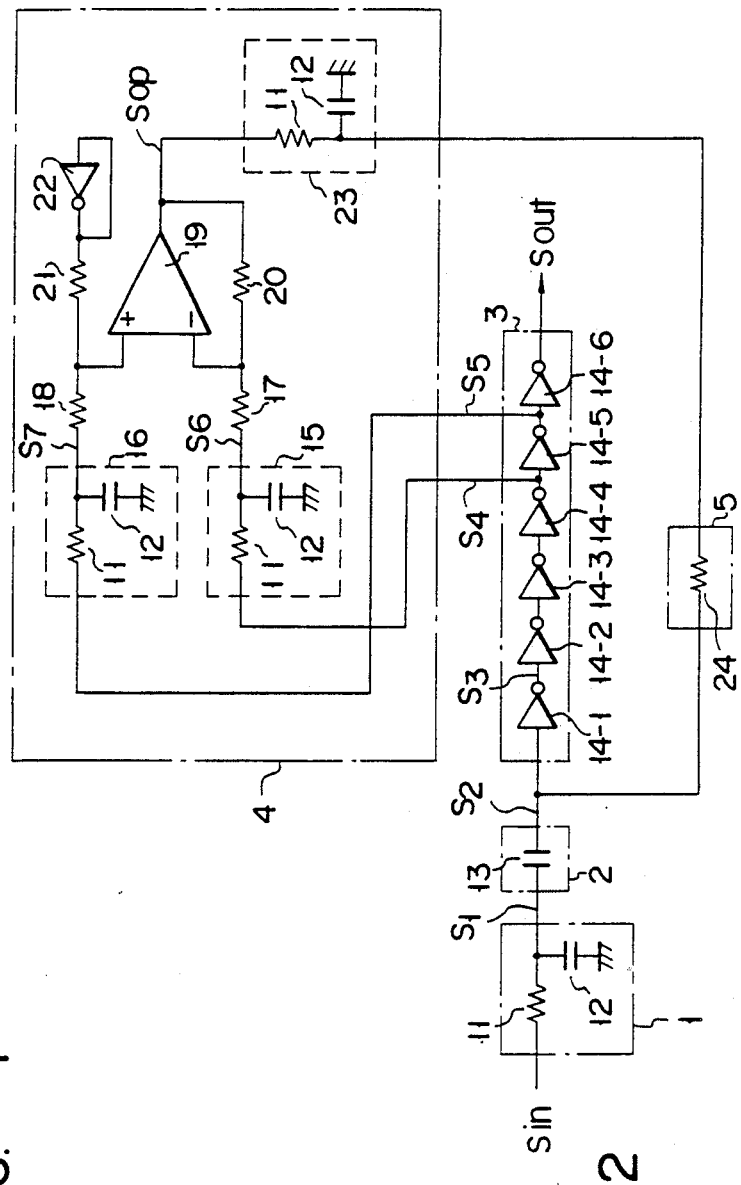
FIG. 2 is a circuit diagram showing a detailed arrangement of an apparatus according to an embodiment of the present invention.

FIG. 2 is a circuit diagram showing a detailed arrangement of an apparatus according to an embodiment of the present invention, which is controlled to cause the output signal $S_{out}$ to have a duty ratio of 50%.

The integrating circuit 1 is constituted by a CR type integrating circuit consisting of a resistor 11 having one terminal to which an input signal $S_{in}$ is supplied, and a capacitor 12 connected between the other terminal of the resistor 11 and the ground potential. The AC coupling circuit 2 is constituted by a capacitor 13 having one terminal to which an output signal $S_1$ from the integrating circuit 1 is supplied. The waveshaping circuit 3 is constituted by an even number (six in this embodiment) of series-connected CMOS inverters 14-1 to 14-6. The first inverter 14-1 receives an output signal $S_2$ from the AC coupling circuit 2. A duty-converted output signal $S_{out}$ is extracted from the last inverter 14-6.

The duty ratio detecting circuit 4 is constituted by CR type integrating circuits each consisting of a resistor 11 and a capacitor 12, which is identical to the integrating circuit 1. More specifically, the duty ratio detecting circuit 4 comprises: integrating circuits 15 and 16 for receiving output signals $S_4$ and $S_5$ from the inverters 14-4 and 14-5 in the waveshaping circuit 3 which are in an inverted relationship; an operational amplifier 19 having an inverting input terminal (−) and a noninverting input terminal (+) for respectively receiving output signals $S_6$ and $S_7$ from the integrating circuits 15 and 16 through resistors 17 and 18 each having resistance $R_1$; a resistor 20 connected between the output terminal and the inverting input terminal of the operational amplifier 19 and having a resistance $R_2$; a resistor 21 having one terminal connected to the noninverting input terminal of the operational amplifier 19 and having a resistance $R_2$; a CMOS inverter 22 having input and output terminals connected to the other terminal of the resistor 21; and a low-pass filter 23, constituted by a CR type integrating circuit consisting of a resistor 11 and a capacitor 12, which is identical to the integrating circuit 1, for receiving an output signal $S_{op}$ from the operational amplifier 19.

In this case, the two resistors 17 and 20 are connected to the operational amplifier 19 in the duty ratio detecting circuit, and the amplifier 19 is negatively fed back. If the amplifier 19 does not include the resistor 21 and the inverter 22, it amplifies the potential difference between a voltage $V_7$ of a signal $S_7$ supplied to the noninverting input terminal (+) and a voltage $V_6$ of a signal $S_6$ supplied to the inverting input terminal (−) at a gain corresponding to the resistance ratio ($R_2/R_1$) of the two resistors 17 and 20, and outputs the amplified difference. However, since the resistor 21 and the inverter 22 are arranged, the operational amplifier 19 outputs a voltage $V_{thC}+(V_7-V_6)\cdot(R_2/R_1)$ obtained by adding a voltage $(V_7-V_6)\cdot(R_2/R_1)$, which is obtained by multiplying a potential difference $(V_7-V_6)$ between the signals $S_7$ and $S_6$ by the resistance $(R_2/R_1)$, to a circuit threshold voltage $V_{thC}$ of the inverter 22. If the potential difference between the signals $S_7$ and $S_6$ is zero, the amplifier 19 outputs the circuit threshold voltage $V_{thC}$ of the inverter 22.

The feedback circuit 5 is constituted by a resistor 24 connected between the low-pass filter 23 in the duty ratio detecting circuit 4 and the output side of the AC coupling circuit 2.

An operation of the apparatus having the above-described arrangement will be described below with reference to a timing chart shown in FIG. 3. For the sake of a description, assume that each CMOS inverter is operated upon application of a power source voltage $V_{DD}$ and a ground voltage GND, and the amplitude of the input signal $S_{in}$ is set to be a value between $V_{DD}$ and GND.

Assume that a rectangular wave having a duty ratio of 50% or less is input as the input signal $S_{in}$, as shown in FIG. 3. In this case, if one period is represented by T and "H"-level duration in one period is represented by $T_H$, a duty ratio $D_{in}$ of the input signal $S_{in}$ is given as follows:

$$D_{in}=(T_H/T)\times 100 \ (\%) \qquad (1)$$

Upon reception of this input signal $S_{in}$, the integrating circuit 1 outputs a signal $S_1$ whose waveform is sufficiently smoothed as compared with its original waveform. The average DC level of the signal $S_1$ is $D_{in} \cdot V_{DD}$. By passing the signal $S_1$ through the AC coupling circuit 2, only an AC component is obtained at the output side of the circuit 2. Meanwhile, a predetermined voltage is generated by the duty ratio detecting circuit 4 in advance. This voltage is applied, as a DC bias, to the AC component of the signal $S_1$ at the output side of the AC coupling circuit 2. The first inverter 14-1 in the waveshaping circuit 3 waveshapes the signal to which the DC bias was applied, and generates an output signal $S_3$ having a rectangular waveform. More specifically, if the level of the signal to which the DC bias was applied is lower than the circuit threshold voltage level of the first inverter 14-1, the signal $S_3$ goes to "H" level ($V_{DD}$). Otherwise, the signal $S_3$ goes to "L" level (GND). The signal $S_3$ is sequentially inverted by the inverters 14-2 to 14-6 in the waveshaping circuit 3 in this order. Subsequently, an output signal $S_4$ from the inverter 14-4, in phase with the signal $S_3$, is supplied to the integrating circuit 15. The integrating circuit 15 outputs a signal $S_6$ which is sufficiently smoothed as compared with the original input signal ($S_4$) in the same manner as in the integrating circuit 1. Meanwhile, an output signal $S_5$ from the inverter 14-5, which has the opposite phase (inverted relationship) to that of the signal $S_3$, is supplied to the integrating circuit 16. The integrating circuit 16 then outputs a signal $S_7$ which is sufficiently smoothed as compared with the original input signal ($S_5$).

In this case, if the voltage generated by the duty ratio detecting circuit 4 is small, and the average DC level of the signal $S_2$ upon application of the DC bias is lower than the circuit threshold voltage level of the first inverter 14-1 in the waveshaping circuit 3, the duty ratio of the output signal $S_3$ from the first inverter 14-1 is larger than 50%. Consequently, the duty ratio of the output signal $S_3$ from the inverter 14-4, which is in phase with the above signal $S_3$, is smaller than 50%, and the duty ratio of the output signal $S_3$ from the inverter 14-5, which has the opposite phase to that of the above signal $S_3$, is smaller than 50%. In this case, therefore, the DC level of the output signal $S_7$ from the integrating circuit 16 becomes higher than that of the output signal $S_6$ from the integrating circuit 15. The operational amplifier 19 outputs a voltage obtained by adding the circuit threshold voltage $V_{thC}$ of the inverter 22 to a voltage obtained by multiplying the potential difference between the signals $S_7$ and $S_6$ by the resistance ratio ($R_2/R_1$). This voltage is integrated by the integrating circuit 23, and is then supplied to the output side of the AC coupling circuit 2 through the feedback circuit 5. As a result, the level of a DC bias to be applied to the AC component of the signal $S_1$ output from the AC coupling circuit 2 becomes larger than that of the previous DC bias.

If the DC bias level of the signal $S_2$ upon application of the DC bias becomes equal to the circuit threshold voltage level of the first inverter 14-1 in the waveshaping circuit 3, the duty ratio of the signal $S_3$ output from the first inverter 14-1 becomes 50%. At this time, the duty ratios of the output signal $S_4$ and the output signal $S_5$ having the inverted relationship therewith, which are respectively output from the inverters 14-4 and 14-5, become 50%. In this case, therefore, the output signals $S_6$ and $S_7$ from the integrating circuits 15 and 16 have the same level, and the output signal level of the operational amplifier 19 is set at the circuit threshold voltage $V_{thC}$ of the inverter 22. In this case, the duty of the output signal $S_{out}$ also becomes 50%.

That is, if there is a difference between the output voltages of the integrating circuits 15 and 16, a voltage which is larger or smaller than the circuit threshold voltage $V_{thC}$ of the inverter 22 is output from the duty ratio detecting circuit 4 due to a feedback effect. When this voltage is applied to the input side of the waveshaping circuit 3 through the feedback circuit 5, a signal having a waveform slightly deviated from that of the circuit threshold voltage is input to the first inverter 14-1 in the waveshaping circuit 3. This signal is waveshaped into a rectangular wave by the waveshaping circuit 3. After this signal is passed through the integrating circuits 15 and 16, the deviation between the output voltages from the integrating circuits 15 and 16 is reduced. Finally, the output voltages from the integrating circuits 15 and 16 coincide with each other.

As described above, in the apparatus of this embodiment, when a predetermined voltage is fed back to the output side of the AC coupling circuit 2 through the feedback circuit 5, the DC bias level of the signal $S_2$ finally coincides with the circuit threshold voltage $V_{thC}$ of the inverter 14-1, and hence duty ratio control is performed to allow the output signal $S_{out}$ to have a duty ratio of 50%.

In the apparatus of the above-described embodiment, if it is required to accurately control the duty ratio of the output signal $S_{out}$ to be 50%, the circuit threshold voltages $V_{thC}$ of the first CMOS inverter 14-1 in the waveshaping circuit 3 and of the CMOS inverter 22 in the duty ratio detecting circuit 4 must be set to coincide with each other. If there is a difference between both the circuit threshold voltages, the duty ratio of the output signal $S_{out}$ may deviate from 50%. In this case, an output voltage $V_{op}$ from the operational amplifier 19 is given by the following equation:

$$V_{op} = V_{thC} + (R_2/R_1)(V_7 - V_6) \qquad (2)$$

In this case, the output voltages $V_6$ and $V_7$ from the integrating circuits 15 and 16 are associated with the duty ratios of the input signals $S_4$ and $S_5$. The voltages $V_6$ and $V_7$ are given by the following equations, provided that the duty ratios of the input signals $S_4$ and $S_5$ are respectively represented by $(1-D)$ and $D$:

$$V_6 = D \cdot V_{DD} \qquad (3)$$

$$V_7 = (1-D) \cdot V_{DD} \qquad (4)$$

Therefore, $V_{op}$ is given as follows:

$$V_{op} = V_{thC} + (R_2/R_1)(2D-1) \cdot V_{DD} \qquad (5)$$

The voltage $V_{op}$ represented by equation (5) is supplied, as a DC level, to the first inverter 14-1 in the waveshaping circuit 3. If this value is deviated from the threshold voltage of the inverter 14-1, a duty $D_{out}$ of the output signal $S_{out}$ is given by the following equation:

$$D_{out} = \tfrac{1}{2} + (\tfrac{1}{2}) \cdot (R_1/R_2) \cdot (V_{DD} - V_{thC})/V_{DD} \qquad (6)$$

That is, the duty ratio of the output signal $S_{out}$ deviates from 50%. Therefore, in order to prevent the duty ratio from deviating from 50%, the circuit threshold voltages of the first CMOS inverter 14-1 in the waveshaping circuit 3 and of the CMOS inverter 22 in the duty ratio detecting circuit 4 must be set to coincide with each other.

If the frequency and period of the input signal $S_{in}$ are respectively represented by $f_0$ and $T_0$, in order to prevent an excessive decrease in amplitude of the output signal $S_1$ from the integrating circuit 1, and to keep the difference between the maximum and minimum values of a waveform to be supplied to the AC coupling circuit 2 within a range relatively smaller than that of the difference between the power source voltage and the ground voltage, a time constant $\tau_1$ of the integrating circuit 1 is preferably set to be about $0.3T_0$. In this case, if $f_0$ is 16 MHz, $\tau_1$ is 19 ns. Therefore, the resistor 11 and the capacitor 12 in the integrating circuit 1 respectively have, a resistance of 9.5 k$\Omega$ and a capacitance of 2 pF, and hence can be easily integrally mounted on a semiconductor substrate. In addition, if a time constant $\tau_2$ of the AC coupling circuit 2 and the feedback circuit 5 is set to be about several tens or several hundreds times the time constant $\tau_1$, DC level control can be performed without interfering with an AC coupling operation. In this case, if the time constant $\tau_2$ is set to be several hundreds times the time constant $\tau_1$, $\tau_2$ becomes 1.9 $\mu$s. As a result, the capacitance of capacitor 13 and the resistance of the resistor 24 can be respectively set to be values, e.g., 10 pF and 190 k$\Omega$, allowing easy integration on a semiconductor substrate.

Similarly, even if time constants $\tau_3$ of the integrating circuits 15 and 16 in the duty ratio detecting circuit 4 are set to be about several tens times $T_0$, a DC level can be satisfactorily detected. In addition, if a time constant $\tau_4$ of the low-pass filter 23 for stabilizing an output from the operational amplifier 19 is set to be several or several tens times the time constant $\tau_3$, the low-pass filter 23 can be satisfactorily operated. Therefore, these components can be integrally mounted on a semiconductor substrate without posing any problem. Furthermore, other resistors can also be integrated.

FIG. 4 is a circuit diagram showing a detailed arrangement of the integrating circuit 1 or each of the integrating circuits 15, 16, and low-pass filter 23 of the apparatus in the above-described embodiment. As shown in FIG. 4, the resistor 11 is constituted by an n-channel MOS transistor 31 having a gate for receiving the power source voltage $V_{DD}$ and a p-channel MOS transistor 32 having a gate for receiving the ground voltage, which are connected in parallel with each other through their sources and drains. The resistance of the resistor 11 is controlled by adjusting channel widths W of both the MOS transistors.

FIG. 5 is a circuit diagram showing a detailed arrangement of each CMOS inverter of the apparatus in the above-described embodiment. As shown in FIG. 5, the CMOS inverter is constituted by p-channel and n-channel MOS transistors 33 and 34 having sources and drains which are series-connected to each other between the power source voltage $V_{DD}$ and the ground voltage, and having gates which are commonly connected to each other. In order to match the circuit threshold voltage of the first CMOS inverter 14-1 in the waveshaping circuit 3 with that of the CMOS inverter 22 in the duty ratio detecting circuit 4, the $\beta$ ratio, i.e., ratio Wp/Wn of channel width Wp of the P-channel transistor 33 to that Wn of the N-channel transistor 34, in one inverter, is equal to that in the other inverter.

FIG. 6 is a circuit diagram showing a detailed arrangement of the operational amplifier 19 of the apparatus i the above-described embodiment. This circuit comprises: driving n-channel MOS transistors 35 and 36 having gates respectively connected to the inverting input terminal ($-$) and the noninverting input terminal ($+$); two current-mirror connected p-channel MOS transistors 37 and 38 respectively serving as loads of the transistors 35 and 36; an n-channel MOS transistor 39, having a gate for receiving a predetermined DC bias voltage $V_{bias}$, for supplying operating currents to the transistors 35 and 36; an output p-channel MOS transistor 40 having a gate connected to a node between the transistors 36 and 38; a source current n-channel MOS transistor 41, having a gate for receiving the bias voltage $V_{bias}$, for supplying an operating current to the transistor 40; and a feedback capacitor 42 connected between the drain and gate of the transistor 40.

Another embodiment of the present invention will be described below.

Figure 7:
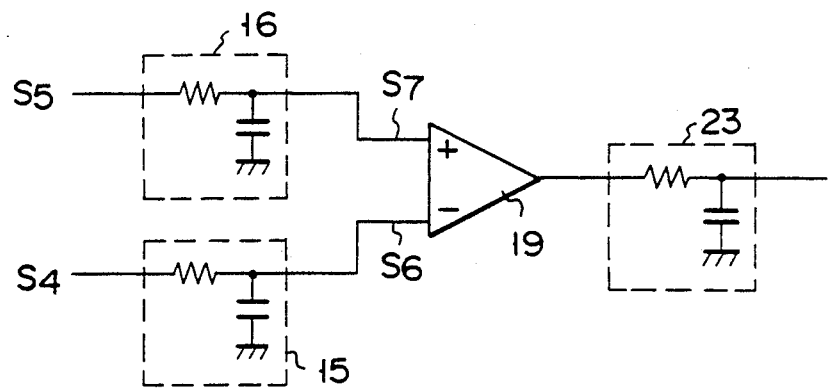
FIGS. 7 to 9 are circuit diagrams each showing an arrangement of a partial circuit of an apparatus according to another embodiment of the present invention.

FIG. 7 shows an arrangement of a duty ratio detecting circuit of a duty ratio control circuit apparatus according to the second embodiment of the present invention. The duty ratio detecting circuit of this embodiment is designed to control the duty ratio of an output signal $S_{out}$ to be 50% in the same manner as in the circuit shown in FIG. 2. However, the resistors 17, 18, 20, and 21, and the inverter 22 in FIG. 2 are omitted from this duty ratio detecting circuit. Since the resistors 17 and 20 are omitted in this embodiment, the signals $S_7$ and $S_6$ are compared with each other by using the inherent gain of the operational amplifier 19. That is, in the apparatus of this embodiment, the signals $S_7$ and $S_6$ are compared with each other, and an "H"-level or "L"-level digital signal is output. This digital signal is smoothed by a low-pass filter 23, and is fed back to the output side of the AC coupling circuit 2 through the feedback circuit 5.

Figure 8:
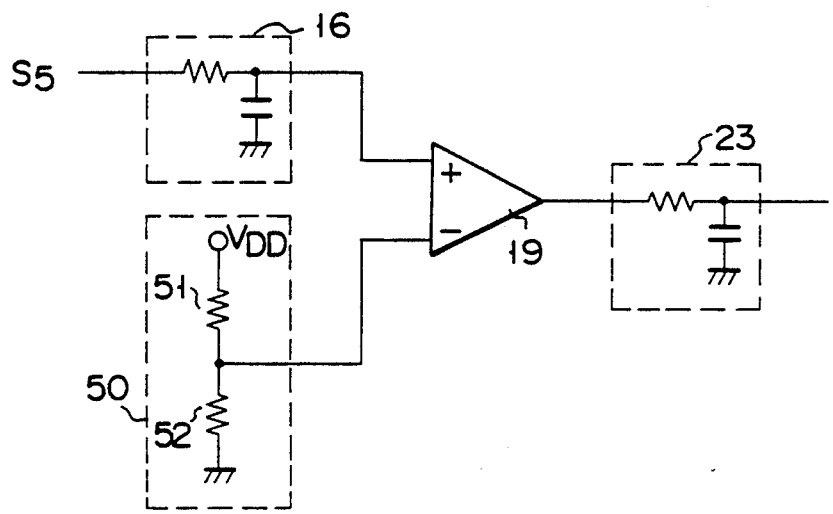

FIG. 8 shows an arrangement of a duty ratio detecting circuit of a duty ratio control circuit apparatus according to the third embodiment of the present invention. The duty ratio detecting circuit in this embodiment is designed to control the duty ratio of an output signal $S_{out}$ to be an arbitrary value other than 50%. The integrating circuit 15, the resistors 17, 18, 20, and 21, and the inverter 22 in FIG. 2 are omitted from this circuit, and a voltage setting circuit 50 is added in place of the integrating circuit 15. The voltage setting circuit 50 is constituted by two resistors 51 and 52 series-connected between the power source voltage $V_{DD}$ and the ground voltage. A duty ratio setting voltage determined by the resistance ratio of the resistors 51 and 52 is applied to the inverting input terminal ($-$) of the operational amplifier 19. Subsequently, duty ratio control of the output signal $S_{out}$ is performed in accordance with this duty setting voltage. In this embodiment, an "H"-level or "L"-level digital signal is also output from the operational amplifier 19. The digital signal is then smoothed by a low-pass filter 23, and is fed back to the AC coupling circuit 2.

Figure 9:
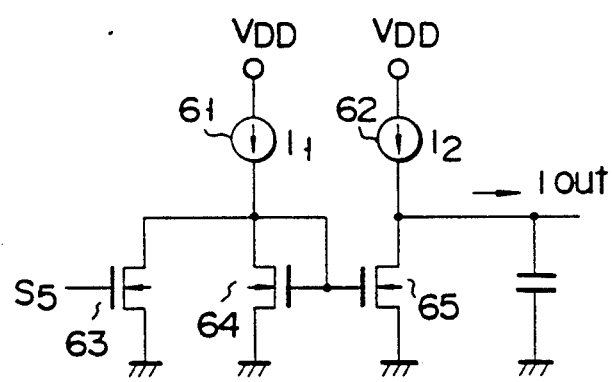

FIG. 9 shows an arrangement of a duty ratio detecting circuit of a duty ratio control circuit apparatus according to the fourth embodiment of the present invention. Similarly, the duty ratio detecting circuit of this embodiment is designed to control the duty ratio of an output signal $S_{out}$ to be an arbitrary value other than 50%. This circuit comprises a current source 61 for a current value $I_1$, a current source 62 for a current value $I_2$, and three n-channel MOS transistors 63, 64, and 65.

In this circuit, if the signal $S_5$, supplied to the gate of the transistor 63, is set at "H" level and this transistor 63 is ON, an output current $I_{out}$ is a current of the current value $I_2$ of the current source 62. In contrast to this, if the signal $S_5$ is set at "L" level and the transistor 63 is OFF, the output current $I_{out}$ is given by the following equation:

$$I_{out} = I_2 - I_1 \cdot (N65/N64) \quad (7)$$

where N64 and N65 are the W/L ratios of the transistors 64 and 65, respectively. While switching of the transistor 63 is performed to set the output current value $I_{out}$ to be zero, a detection voltage is fixed to a certain value. Therefore, a duty ratio D of the apparatus in this embodiment is represented by the following equation:

$$D = 1 - (I_2/I_1)(N64/N65) \quad (8)$$

Figure 10:
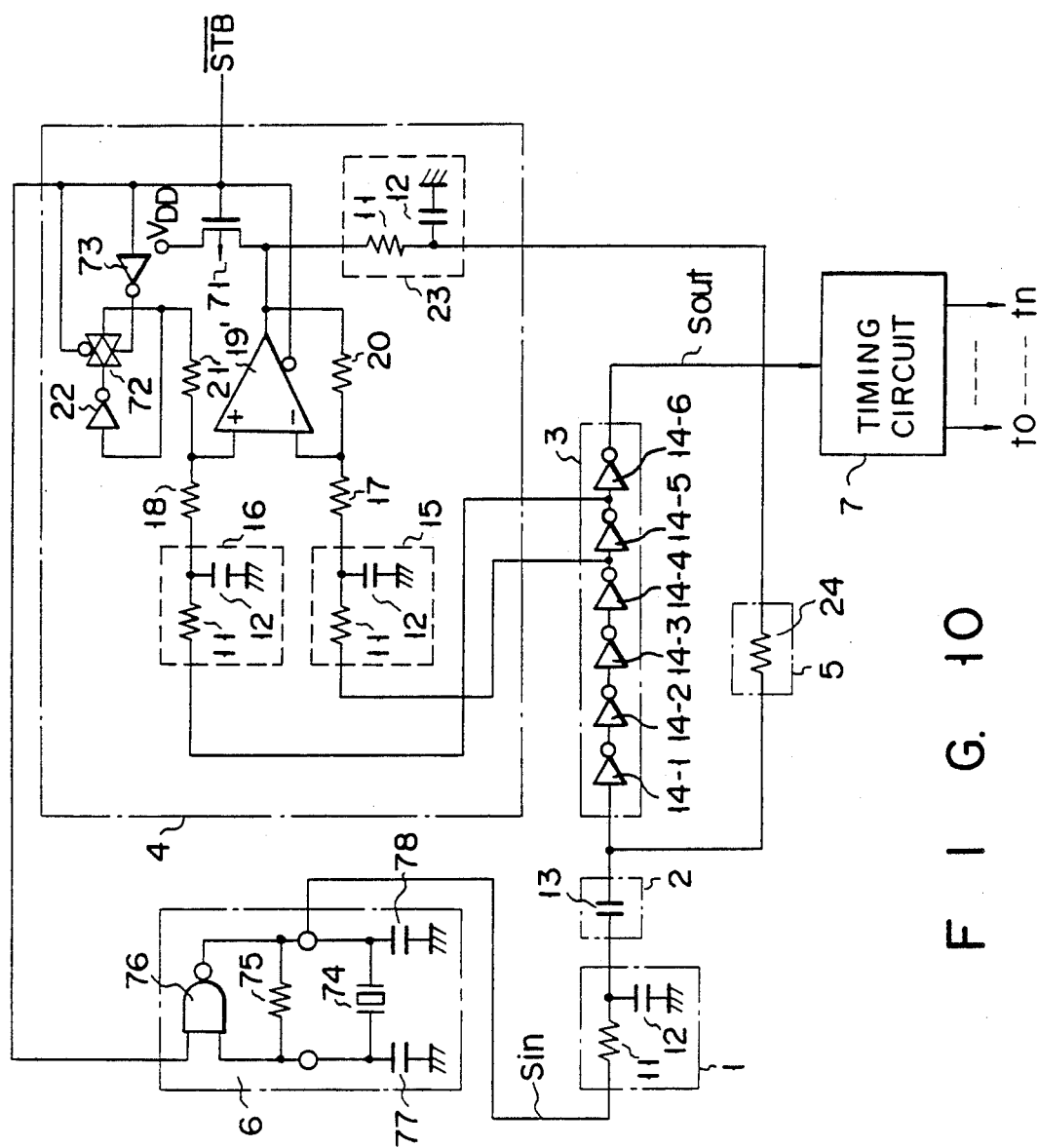
FIG. 10 is a circuit diagram showing an overall arrangement of an apparatus according to still another embodiment of the present invention.

FIG. 10 is a circuit diagram showing an arrangement of an overall duty ratio control circuit apparatus according to the fifth embodiment of the present invention. The same reference numerals in FIG. 10 denote the same parts as in FIG. 2, and a description thereof will be omitted.

The apparatus of this embodiment is obtained by adding a standby function for reducing current consumption during an inoperative period to the apparatus of the embodiment described with reference to FIG. 2. In addition, the apparatus is designed to supply an output signal from a quartz oscillator 6 as an input signal $S_{in}$, and to supply an output signal $S_{out}$ from the waveshaping circuit 3, as a fundamental clock, to a timing circuit 7 for generating various timing signals used for operational control of a microcomputer.

In order to add the standby function, in the above-described duty ratio detecting circuit 4, the operational amplifier 19 is replaced with an operational amplifier 19' whose output is set at a high-impedance state in accordance with a standby control signal $\overline{STB}$. In addition, the source-drain path of a p-channel MOS transistor 71 is inserted between the output terminal of the operational amplifier 19' and the power source voltage $V_{DD}$, and the standby control signal $\overline{STB}$ is supplied to the gate of the transistor 71. Furthermore, an analog switch 72 is inserted between the output and input terminals of the inverter 22. This analog switch 72 is ON/OFF-controlled by the standby control signal $\overline{STB}$ and an output signal from a CMOS inverter 73 for inverting the signal $\overline{STB}$.

The quartz oscillator 6 comprises a quartz vibrator 74, a feedback resistor 75, a CMOS-NAND gate 76, and capacitors 77 and 78. The standby control signal $\overline{STB}$ is supplied to one input terminal of the CMOS-NAND gate 76. The signal $\overline{STB}$ controls stopping and resuming of an oscillating operation.

The timing circuit 7 receives the signal $S_{out}$ from the waveshaping circuit 3 as a fundamental clock and generates various timing signals t0 to tn used for operation control of the microcomputer.

With this arrangement, since signal feedback is performed in the quartz oscillator 6 through the NAND gate 76 during an operative period in which the standby control signal $\overline{STB}$ is at "H" level, the quartz vibrator 74 performs an oscillating operation at an inherent frequency. As a result, an input signal $S_{in}$ having a predetermined frequency is supplied to the integrating circuit 1. Meanwhile, in the duty ratio detecting circuit 4, the operational amplifier 19' is operated, the p-channel MOS transistor 71 is turned off, and the analog switch 72 is turned on. Therefore, similar to the case described with reference to FIG. 2, output signals from the integrating circuits 15 and 16 are compared by the operational amplifier 19', and a signal having the voltage given by equation (2) is output from the operational amplifier 19'.

In contrast to this, during a standby period in which the standby control signal $\overline{STB}$ is at "L" level, in the quartz oscillator 6, an output signal from the NAND gate 76 is fixed to "H" level, and the oscillating operation is stopped. Therefore, only a leakage current contributes to current consumption in the quartz oscillator 6. At this time, an "H"-level signal is supplied to the integrating circuit 1, and hence the level of the input side of the AC coupling circuit 2 is set at "H" level.

Meanwhile, in the duty ratio detecting circuit 4, an output from the operational amplifier 19' is set in a high-impedance state. In addition, since the p-channel MOS transistor 71 is turned on, the output terminal of the operational amplifier 19' is set at "H" level ($V_{DD}$). The level of the output terminal of the operational amplifier 19' is supplied to the output side of the AC coupling circuit 2 through the low-pass filter 23 and the feedback circuit 5. As a result, the potential difference between the input and output terminals of the AC coupling circuit 2 becomes zero, and only a leak current contributes to current consumption therein.

Subsequently, the analog switch 72 is turned off, and the short-circuit state between the input and output terminals of the inverter 22 is released. With this operation, even while the output level of the inverter 22 is at "H" level, since the output terminal is set in a potentially floating state, only a leak current contributes to current consumption in the inverter 22.

As described above, in the apparatus of this embodiment, a current consumption during a standby period is greatly reduced. In addition, since the potential difference between the input and output terminals of the AC coupling circuit 2, i.e., the potential difference between both the terminals of the capacitor 13, is zero during a standby period, the time required to stabilize the apparatus after the next operation is started can be shortened.

In the duty ratio control circuit apparatus according to the embodiment in FIG. 10, all the components except for the quartz vibrator 74 in the quartz oscillator 6 can be integrally mounted on a semiconductor substrate. Therefore, the duty ratio control circuit apparatus of the above-described embodiment can be incorporated in an IC for a microcomputer.

Figure 11:
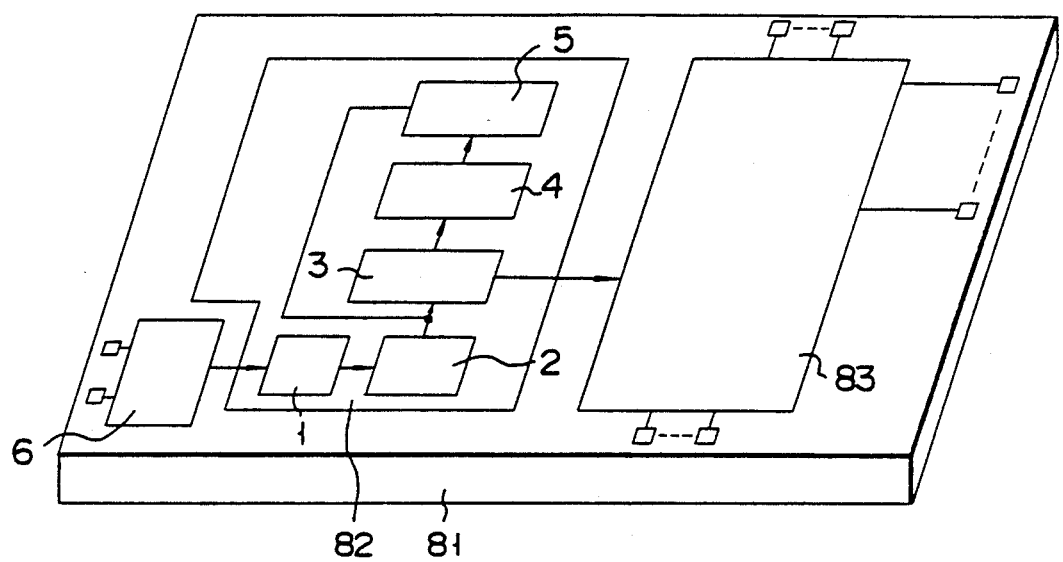
FIG. 11 is a perspective view showing a state wherein the apparatus in FIG. 10 is arranged on a semiconductor chip.

FIG. 11 is a perspective view showing an arrangement of a semiconductor chip obtained by incorporating the duty ratio control circuit apparatus of the above-described embodiment in an IC for a microcomputer. This semiconductor chip is constituted by a single semiconductor substrate 81. Referring to FIG. 11, reference numeral 82 denotes a duty ratio control circuit apparatus including the integrating circuit 1, the AC coupling circuit 2, the waveshaping circuit 3, the duty ratio control circuit 4, and the feedback circuit 5. An input signal having a predetermined frequency and obtained by the quartz oscillator 6 is supplied to the duty ratio control circuit apparatus 82. In FIG. 11, reference numeral 83 denotes a microcomputer including the timing circuit 7 (shown in FIG. 10).

If the quartz oscillator 6 is not to be integrally mounted on a semiconductor substrate on which a duty ratio control circuit apparatus is integrally mounted, since the quartz vibrator 74 must be arranged as an external part, external terminals are required. However, if only a duty ratio control circuit apparatus is to be integrally mounted on a semiconductor substrate, no external terminals are required.

As described above, the apparatus of each embodiment has the following advantages.

(a) The duty ratio control circuit apparatus can be easily arranged on a semiconductor IC substrate for a microcomputer, or the like.

(b) Since the apparatus includes the integrating circuit 1, duty ratio control can be performed even if an input signal having an arbitrary waveform, such as a rectangular wave, is supplied.

(c) The duty ratio of a signal can be controlled to be an arbitrary value.

(d) The duty ratio of a signal can be very easily controlled to be 50%.

(e) Since the apparatus can be integrated without external parts, it can be easily arranged on a semiconductor substrate.

(f) The duty ratio control circuit apparatus can be integrated without external terminals.

(g) Since the circuit constant is determined by only resistances and capacitances, the apparatus is free from the influences of, e.g., manufacturing variation, temperature changes, and source voltage variation. Hence, a stable operation can be expected.

(h) Since the circuits are constituted by CMOS elements, the current consumption can be reduced to several $\mu A$ to several hundreds $\mu A$. In addition, a low-current-consumption operation is realized by the standby function, only a leakage current contributes to current consumption.

(i) A high-frequency operation at 10 MHz or more can be performed. In addition, as the frequency is increased, the time constant of each circuit can be decreased. Hence, integration of the apparatus is facilitated, and a pattern area on a chip can be reduced.

(j) The apparatus can be very easily connected to a microcomputer and the like which is integrally mounted on the same substrate.

As has been described above, according to the present invention, the duty ratio control circuit apparatus can be easily arranged on a semiconductor IC substrate for a microcomputer or the like in an excellent state. In addition, duty ratio control can be performed with respect to an arbitrary waveform such as a rectangular wave, and the duty ratio of a signal can be controlled to be an arbitrary value, especially 50%.

What is claimed is:

1. A duty ratio control circuit apparatus comprising:
    a first integrating circuit for integrating an input signal;
    an AC coupling circuit for allowing an AC component of an output from said first integrating circuit to pass therethrough;
    a waveshaping circuit for waveshaping an output from said AC coupling circuit and extracting a duty converted output signal;
    a duty ratio detecting circuit, for receiving a waveshaped output from said waveshaping circuit and for generating a voltage corresponding to a difference between a predetermined duty ratio and a duty ratio of the waveshaped output from said waveshaping circuit, and which comprises:
        a second integrating circuit for receiving a first waveshaped output from said waveshaping circuit;
        a third integrating circuit for receiving a second waveshaped output having a relationship with the first waveshaped output from said waveshaping circuit;
        a comparing circuit, with an output terminal having a low pass filter coupled thereto, for receiving and comparing outputs from said second and third integrating circuits;
        a DC bias generating circuit for applying a predetermined DC bias to an input terminal of said comparing circuit to which an output from one of said second and third integrating circuits is supplied; and
        a feedback circuit for feeding back an output form said duty ratio detecting circuit to an output side of said AC coupling circuit.

2. An apparatus according to claim 1, wherein said DC bias generating circuit comprises a inverter circuit having short-circuited input and output terminals.

3. An apparatus according to claim 1, wherein said waveshaping circuit comprises a first inverter circuit, with a circuit threshold value, comprising a plurality of series-connected inverter circuits with a first stage inverter circuit; and
    wherein said bias generating circuit, comprising:
        a second inverter circuit, with a circuit threshold value, having short-circuited input and output terminals, the circuit threshold value of said second inverter circuit being set to be equal to the circuit threshold value of the first-stage inverter circuit of said first inverter circuit, said DC bias generating circuit applying a predetermined DC bias voltage to an input terminal to which an output from one of said second and third integrating circuits is supplied.

4. An apparatus according to claim 3, wherein each of said first-stage inverter circuits of said first inverter circuit in said waveshaping circuit, and said second inverter circuit, comprising said DC bias generating circuit, comprises p-channel and n-channel MOS transistors, wherein geometrical size ratios of said p-channel and n-channel MOS transistors of said first and second inverter circuits are matched with each other so that the circuit threshold values of said first and second inverter circuits are equal.

5. An apparatus according to claim 1, wherein an output from a quartz oscillating circuit is supplied, as said input signal, to said first integrating circuit, and an output signal from said waveshaping circuit is supplied, as a fundamental clock, to a timing circuit.

6. An apparatus according to claim 1, wherein said duty ratio detecting circuit generates a voltage corresponding to a difference between a duty ratio of 50% and a duty ratio of a waveshaped output from said waveshaping circuit.

7. An apparatus according to claim 1, wherein a low-pass filter circuit is further connected to an output terminal of said comparing circuit.

8. A microcomputer system comprising:

an oscillating circuit;

a first integrating circuit for integrating an output from said oscillating circuit;

an AC coupling circuit for allowing an AC component of an output from said integrating circuit to pass therethrough;

a waveshaping circuit for waveshaping an output from said AC coupling circuit and extracting a duty-converted output signal;

a duty ratio detecting circuit for receiving a waveshaped output from said waveshaping circuit and generating a voltage corresponding to a duty of the output;

a feedback circuit for feeding back an output from said duty ratio detecting circuit to an output side of said AC coupling circuit; and a microcomputer for receiving the duty-converted output extracted by said waveshaping circuit as a fundamental clock.

9. A system according to claim 8, wherein said duty ratio detecting circuit generates a voltage corresponding to a difference between a duty ratio of 50% and a duty ratio of the waveshaped output from said waveshaping circuit.

10. A System according to claim 9, wherein said duty ratio detecting circuit comprises:

a first integrating circuit for receiving a first waveshaped output from said waveshaping circuit;

a second integrating circuit for receiving a second waveshaped output having an inverted relationship with the first waveshaped output from said waveshaping circuit; and a comparing circuit for receiving and comparing outputs from said first and second integrating circuits.

11. A system according to claim 10, wherein a low-pass filter circuit is further connected to an output terminal of said comparing circuit.

12. A system according to claim 10, wherein said duty ratio detecting circuit further comprises a DC bias generating circuit for applying a predetermined DC bias to an input terminal of said comparing circuit to which an output from one of said first and second integrating circuits is supplied.

13. A system according to claim 12, wherein said DC bias generating circuit comprises a inverter circuit having short-circuited input and output terminals.

14. A system according to claim 8, wherein said waveshaping circuit comprises a first inverter circuit with a plurality of series-connected inverter circuits including a first stage inverter circuit with a circuit threshold value; and said duty ratio detecting circuit comprises:

a second integrating circuit for receiving a first waveshaped output from said waveshaping circuit;

a third integrating circuit for receiving a second waveshaped output having an inverted relationship with the first waveshaped output from said waveshaping circuit;

a comparing circuit or receiving and comparing outputs from said second and third integrating circuits; and a DC bias generating circuit, comprising a second inverter circuit with a circuit threshold value and having short-circuited input and output terminals, the circuit threshold value of said second inverter circuit being set to be equal to the circuit threshold value of the first-stage inverter circuit of said first inverter circuit, said DC bias generating circuit applying a predetermined DC bias voltage to an input terminal to which an output from one of said second and third integrating circuits is supplied.

15. A system according to claim 14, wherein each of said first-stage inverter circuit of said first inverter circuit in said waveshaping circuit, and said second inverter circuit, comprising said DC bias generating circuit, comprises p-channel and n-channel MOS transistors, wherein geometrical size ratios of said p-channel and n-channel MOS transistors of said first and second inverter circuits are matched with each other so that the circuit threshold values of said first and second inverter circuits are equal.

16. A system according to claim 8, wherein all of said circuits except for said oscillating circuit are formed on a single semiconductor substrate.

* * * * *

UNITED STATES PATENT AND TRADEMARK OFFICE
CERTIFICATE OF CORRECTION

Page 1 of 2

PATENT NO. : 5,057,702
DATED : October 15, 1991
INVENTOR(S) : Nobutaka Kitagawa et al.

It is certified that error appears in the above-identified patent and that said Letters Patent is hereby corrected as shown below:

Title page, item [54], line 1, and col. 1, line 1, change "RADIO" to --RATIO--.

Abstract, line 5, change "coverted" to --converted--.
Claim 1, column 11, line 68, change "duty converted" to --duty-converted--.
Claim 1, column 12, line 23, change "form" to --from--.
Claim 2, column 12, line 27, change "a" to --an--.
Claim 3, column 12, line 34, before "bias" insert --DC--.
Claim 3, column 12, line 34, change "comprising" to --comprises--.
Claim 10, column 13, line 25, change "System" to --system--.
Claim 13, column 14, line 2, change "a" to --an--.

UNITED STATES PATENT AND TRADEMARK OFFICE
CERTIFICATE OF CORRECTION

PATENT NO. : 5,057,702

DATED : October 15, 1991

INVENTOR(S) : Nobutaka Kitagawa et al.

It is certified that error appears in the above-identified patent and that said Letters Patent is hereby corrected as shown below:

```
Claim 14, column 14, line 17, change "or" to --for--.
Claim 15, column 14, line 32, change "circuit"
to --circuits--.
```

Signed and Sealed this

Thirteenth Day of July, 1993

Attest:

MICHAEL K. KIRK

*Attesting Officer*       Acting Commissioner of Patents and Trademarks